Figure 1:
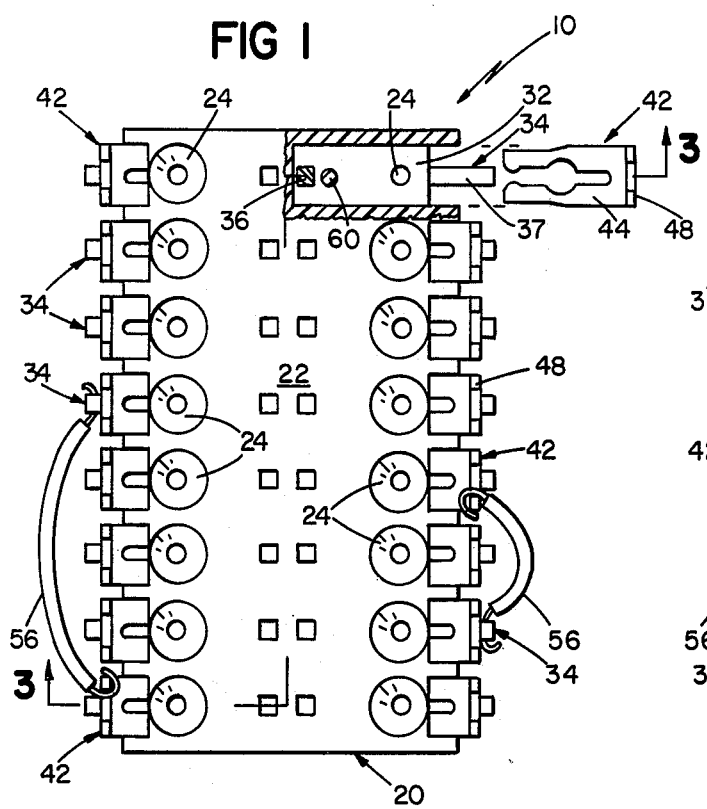

United States Patent [19]

Silverio

[11] 4,155,612
[45] May 22, 1979

[54] ELECTRONIC PROGRAMMABLE ADAPTER

[75] Inventor: Shaun D. Silverio, Beverly, Mass.

[73] Assignee: Mupac Corporation, Brockton, Mass.

[21] Appl. No.: 883,238

[22] Filed: Mar. 3, 1978

[51] Int. Cl.² ........................................... H01R 13/54
[52] U.S. Cl. .............................. 339/17 CF; 339/18 C; 339/75 M; 339/166 R
[58] Field of Search .............. 339/17 C, 17 CF, 18 R, 339/18 C, 75 M, 166 R

[56] References Cited
U.S. PATENT DOCUMENTS 3,622,950  11/1971  Millinger ........................... 339/75 M Primary Examiner—Gerald A. Dost

[57] ABSTRACT

An electronic programmable adapter for connecting an integrated circuit element having a pin array to an electrically dissimilar socket array. It features slideably mounted connector elements which can be selectively operated to be either disconnected or connected to their corresponding pin elements to make possible external electrical connections between adapter elements elsewhere in the array.

8 Claims, 8 Drawing Figures

ELECTRONIC PROGRAMMABLE ADAPTER

This invention relates to electronic programmable adapters for connecting integrated circuit elements to electrically dissimilar socket arrays.

In the assembly of electronic equipment in which the pin arrays of integrated circuit elements are inserted into corresponding socket arrays on printed circuit boards, problems arise when the manufacturer of the integrated circuit elements electrically changes their pin arrays. In this case, the redesigned integrated circuit element cannot be inserted into the socket array of the existing circuit boards because the electrical connections will be wrong. To avoid having to redesign the existing circuit boards, which is not only expensive, but may even be impractical with equipment already in service in which an integrated circuit element has failed, attempts have been made to provide adapters, such as are disclosed in U.S. Pat. Nos. 4,030,793; 3,693,131 and 3,644,792, for example. However, such heretofore known adapters are deficient in a number of respects, in that they are expensive, or lack the requisite flexibility or ease of operation.

Furthermore, it is desirable to provide an adapter with a socket construction into which the pin array of an integrated circuit element can be inserted without the application of force which might damage it, with the adapter thereafter being operable to provide the necessary electrical connection to the pins of the integrated circuit element.

Accordingly, it is a major object of the present invention to provide a novel adapter for connecting an integrated circuit element to an electrically dissimilar socket array.

It is another object of the invention to provide such an adapter which is electrically programmable to accomodate electrical changes in the pin array of the integrated circuit element.

It is still another object of the invention to provide a novel adapter into which the pin array of an integrated circuit element may be inserted without the necessity of applying force, but which may thereafter be operated to provide proper electrical connection.

It is a still further object of the invention to provide such an adapter which is inexpensive to manufacture and easy to use.

The present invention provides a novel electronic programmable adapter for connecting an integrated circuit element, such as one having a dual-in-line pin array, to an electrically dissimilar socket array, such as on an existing circuit board.

It has a body of plastic insulating material having an array of socket openings for receiving the pins of an integrated circuit element, an array of pin element openings transversely spaced from and overlapping the socket openings and an array of connector element openings intersecting corresponding socket and pin element openings.

A plurality of electrically conductive pin elements are mounted in the pin element openings. Each has an interior portion mounted in a pin element opening, an exterior pin portion for connection to a socket of a socket array and an exterior tab portion for making external programming connections.

A plurality of electrically conductive connector elements are mounted in the connector element openings. Each has an interior portion slideably mounted in a connector element opening, such interior portion being bifurcated with a distal slot portion providing an interference fit with the interior portion of a pin element for selective connection thereto and a proximal slot portion providing an interference fit with the pin of an integrated circuit element. For programmable connection, each of the conductive connector elements has a disconnected position with its proximal slot portion providing an interference fit with the pin of an integrated circuit element and with its distal end spaced from its corresponding pin element interior portion and a connected position with its proximal slot portion providing an interference fit with the pin of an integrated circuit element and with its distal slot portion providing an interference fit with its corresponding pin element interior portion for electrical connection thereto.

The interior portion of the connector elements preferably have a central enlarged portion providing clearance for the free insertion of the pin of an integrated circuit element, with the distal slot portion extending inwardly on one side thereof beyond the central enlarged portion and the proximal slot portion extending outwardly on the other side thereof beyond the central enlarged portion. With this arrangement, there is additionally provided an initial position with the central enlarged portion concentric with its corresponding socket opening for free insertion of the pin of an integrated circuit element and with its distal end spaced from its corresponding pin element interior portion. Detent means may be provided for temporarily maintaining the connector elements in their initial and unconnected positions.

Figure 2:
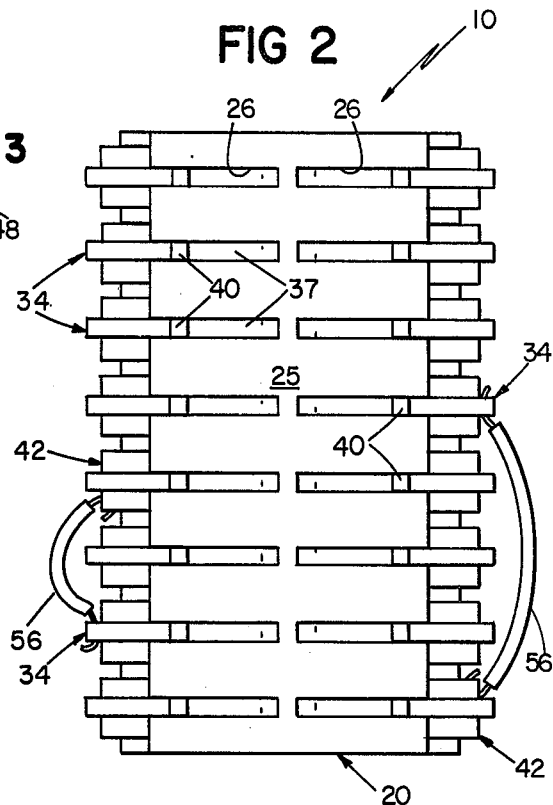
Figure 3:
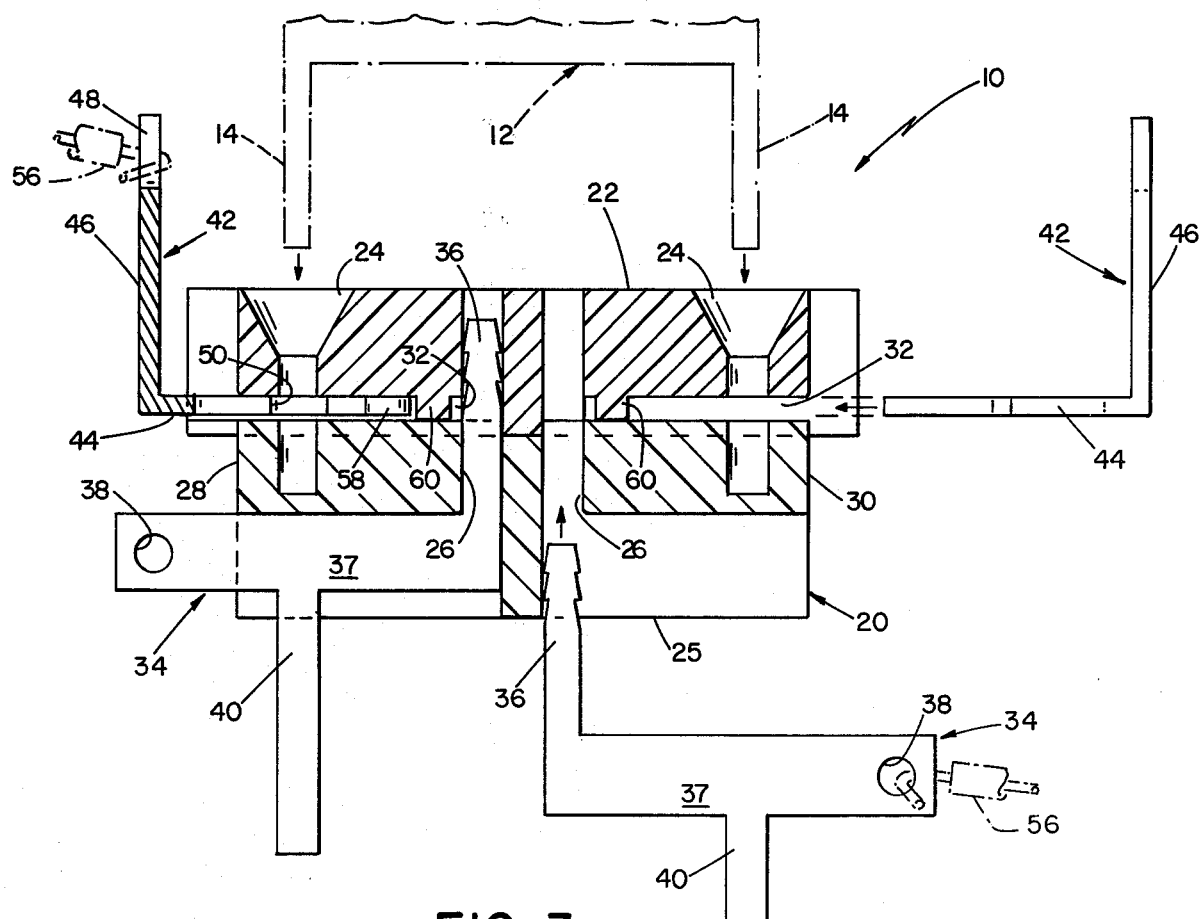
Figure 4:
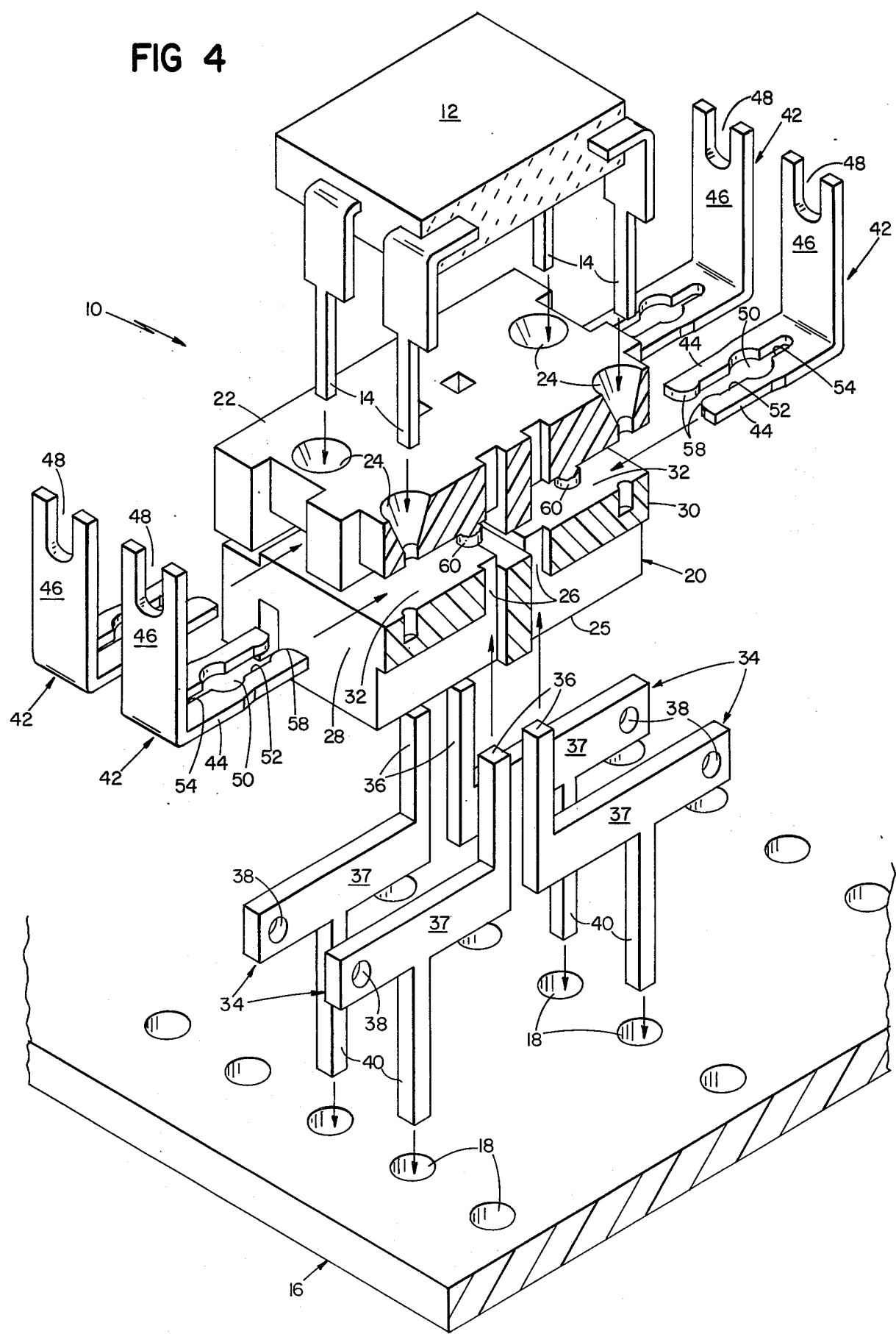
Figure 5:
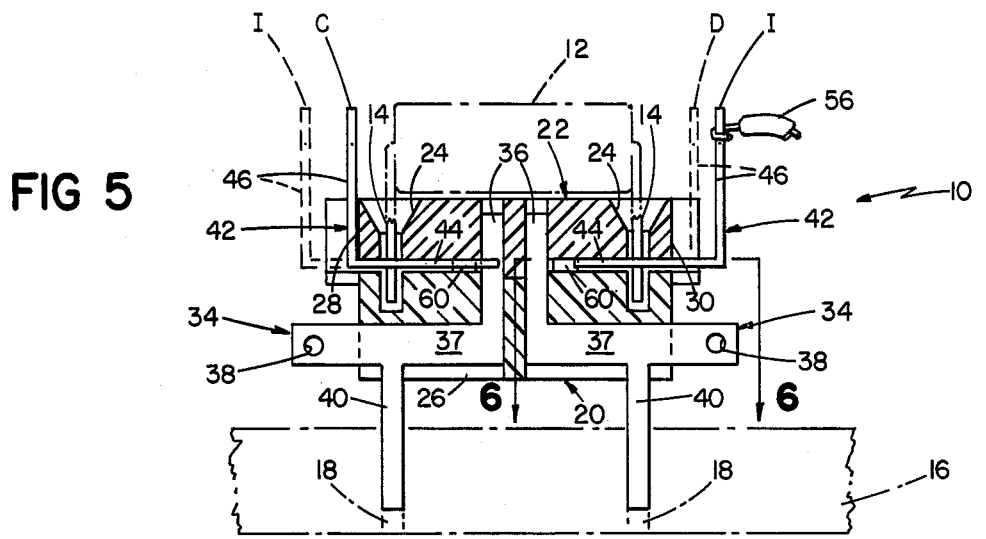
Figure 6:
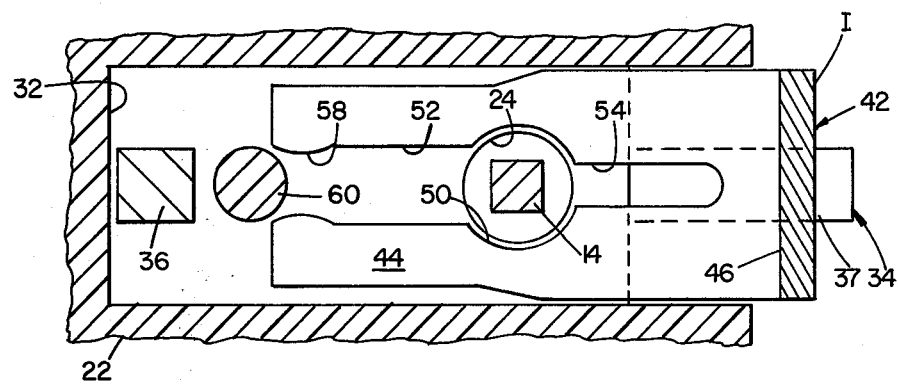
Figure 7:
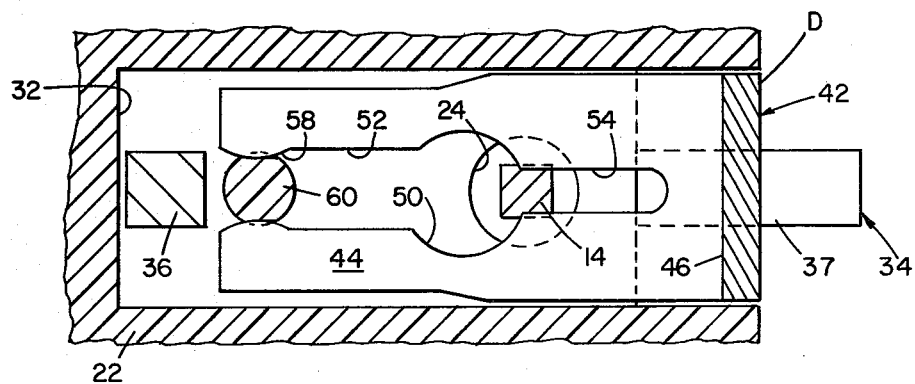
Figure 8:
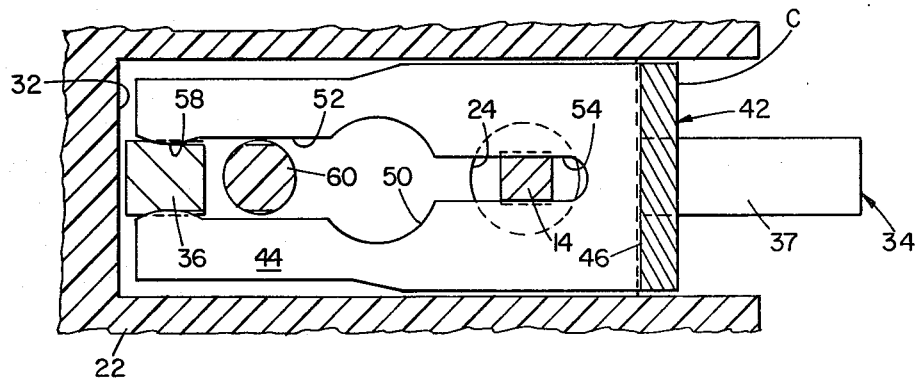

For the purpose of more fully explaining the above and still further objects and features of the invention, reference is now made to the following detailed description of a preferred embodiment thereof, taken together with the accompanying drawings, wherein:

FIGS. 1 and 2 are, respectively, top and bottom views of a preferred embodiment of a programmable adapter according to the invention;

FIG. 3 is a cross-sectional view of the adapter of FIGS. 1 and 2, taken on the line 3—3 of FIGS. 1 and 2;

FIG. 4 is a partial exploded isometric view, partly in cross-section, of the adapter of FIGS. 1 and 2, showing it in relation to an integrated circuit element and a circuit board socket array;

FIG. 5 is a cross-sectional view of the adapter of FIGS. 1 and 2, similar to that of FIG. 3, but also showing it in relation to an integrated circuit element and a circuit board and with its connector elements in each of their three positions, initial, disconnected and connected; and FIGS. 6, 7 and 8 are top sectional detail views, taken on the line 6—6 of FIG. 5, showing a connector element in each of its three positions, respectively, initial, disconnected and connected.

Referring to the drawings, the electronic programmable adapter of the invention, generally designated 10, for connecting an integrated circuit element 12 having a dual-in-line array of pins 14 to a circuit board 16 having an electrically dissimilar dual-in-line array of sockets 18, has all of its elements associated with a body 20 of organic plastic electrical insulating material.

Thus, body 20 has on one pair of its top and bottom opposite sides, on top side 22 a dual-in-line array of socket openings 24 for receiving the pins 14 of integrated circuit element 12 and on bottom side 25 a dual-in-line array of pin element openings 26 therein, each of pin element openings 26 being parallel to, transversely spaced from and overlapping its corresponding socket opening 24. On the other pair of opposite sides, 28 and 30, on each side thereof, there is provided a single-in-line array of connector element openings 32, each of connector openings 32 extending perpendicular to and intersecting a corresponding socket opening 24 and pin element opening 26.

Electrically conductive pin elements 34, preferably of copper, are permanently mounted in each of pin element openings 26. Each of pin elements 34 has an interior pin portion 36 mounted in a pin element opening 26, a transversely extending portion 37 having an exterior tab with a wire connection opening 38 and an exterior pin 40 for connection to a socket 18 of the socket array on circuit board 16. Interior pin portion 36 extends to and beyond its corresponding connector element opening 32.

Electrically conductive connector elements 42, preferably of copper, are slideably mounted in connector element openings 32. Connector elements 42 are preferably of flat sheet metal with an interior portion 44 slideably mounted in a connector element opening 32 and an exterior tab portion 46 bent up at right angles from interior portion 44 in a direction toward the top side 22 of body 20 and extending therebeyond with a wire connection slot 48 on the end thereof. Interior portion 44 of connector elements 42 is bifurcated with a central enlarged portion 50, a distal slot portion 52 extending inwardly from one side of enlarged portion 50, and a proximal slot portion 54 extending outwardly from the other side of enlarged portion 50.

As best shown in FIGS. 5 and 6, in the initial position I of a connector element 42, its central enlarged portion 50 is concentric with its corresponding socket opening 24 for free insertion of the pin 14 of the integrated circuit element 12 so that no force need be applied to integrated circuit pins 14 when they are simultanously inserted into sockets 24. The bell mouthed top ends of socket openings 24 aids in such insertion. In such initial position, tab portions 46 are spaced outwardly beyond sides 28 and 30 of body 20 and the distal end of the interior portion 44 of connector elements 42 are spaced from their corresponding pin element interior portions 36 so that there is no electrical connection therebetween.

As best shown on FIGS. 5, 7 and 8, a connector element 42 may be individually moved from its initial position I to one of two other positions, a disconnected position D in which it remains electrically disconnected from its corresponding pin element interior portion 36 and a connected position C in which it is electrically connected to its pin element interior portion 36. This selection makes possible the electrical programming of the adapter 10 of the invention by connecting, by suitable wires 56, the wire connector slot 48 of a disconnected connector element 42 at one position in the array with the exterior tab opening 38 of a disconnected pin element 34 elsewhere in the array, as shown in FIGS. 1, 2 and 3.

More specifically, referring to FIGS. 5 and 7, connector element 42 is shown in its disconnected position D in which the pin 14 of integrated circuit element 12 has been engaged by the sides of proximal slot portion 54 with an interference fit to provide a proper electrical connection therebetween. However, the distal end of connector element 42 remains spaced from interior portion 36 of a pin element 34, so that there is no electrical connection therebetween.

Referring now to FIGS. 5 and 8, connector element 42 is shown in its connected position C in which the interior portion 36 of its corresponding pin element 34 has been engaged by the sides of distal slot portion 52 with an interference fit to provide a proper electrical connection therebetween. Pin 14 of integrated circuit element 12 remains engaged by the sides of proximal slot portion 54 with an interference fit, since the movement of connector element 42 from disconnected position D to connected position C has merely moved it further along its slot portion 54.

A detent device is preferably provided for temporarily maintaining connector element 42 in its initial I and disconnected D positions. As shown in FIGS. 6, 7 and 8, this may take the form of a post 60 in housing 20 and enlarged inner end elements 60 on connector element 42. Further movement of connector element 42 to its connected position C is accomplished by applying a slight additional force to its exterior tab portion 46.

While a preferred embodiment of the novel adapter of the present invention has been shown and described, it is understood that modifications may be made thereto by those skilled in the art within the spirit of the invention and the scope of the appended claims.

I claim:

1. An electronic programmable adapter for connecting an integrated circuit element to a dissimilar socket array, comprising
  a body of organic plastic insulating material having
  an array of socket openings therein for receiving the pins of an integrated circuit element
  an array of pin element openings therein, each of said pin element openings being transversely spaced from and overlapping one of said socket openings and
  an array of connector element openings therein, each of said connector element openings intersecting a corresponding socket opening and pin element opening
  a plurality of electrically conductive pin elements mounted in said pin element openings, each of said pin elements having
  an interior portion mounted in a said pin element opening and extending to a corresponding connector element opening and
  an exterior pin portion for connection to a socket of a socket array
  a plurality of electrically conductive connector elements slideably mounted in said connector element openings, each of said connector elements having
  an interior portion slideably mounted in a said connector element opening
  said interior portion being bifurcated with a distal slot portion providing an interference fit with a said interior portion of a pin element for selective connection thereto and a proximal slot portion providing an interference fit with the pin of an integrated circuit element,
  each of said conductive connector elements having
  a disconnected position with its proximal slot portion providing an interference fit with the pin of an integrated circuit element and with its distal end spaced from its corresponding pin element interior portion, and
  a connected position with its proximal slot portion providing an interference fit with the pin of an integrated circuit element and with its distal slot portion providing an interference fit with its corresponding pin element interior portion for electrical connection thereto.

2. An electronic programmable adapter for connecting an integrated circuit element to a dissimilar socket array, comprising a body of organic plastic insulating material having an array of socket openings therein for receiving the pins of an integrated circuit element an array of pin element openings therein, each of said pin element openings being transversely spaced from and overlapping one of said socket openings and an array of connector element openings therein, each of said connector element openings intersecting a corresponding socket opening and pin element opening a plurality of electrically conductive pin elements mounted in said pin element openings, each of said pin elements having an interior portion mounted in a said pin element opening and extending to a corresponding connector element opening and an exterior pin portion for connection to a socket of a socket array a plurality of electrically conductive connector elements slideably mounted in said connector openings, each of said connector elements having an interior portion slideably mounted in a said connector element opening and an exterior tab portion, said interior portion being bifurcated with a central enlarged portion providing clearance for the free insertion of the pin of an integrated circuit element element, a distal slot portion extending inwardly on one side thereof and beyond said central enlarged portion providing an interference fit with a said interior portion of a pin element for selective connection thereto and a proximal slot portion extending outwardly on the other side thereof and beyond said central enlarged portion providing an interference fit with the pin of an integrated circuit element, each of said conductive connector elements having an initial position with said central enlarged portion concentric with its corresponding said socket opening for free insertion of the pin of an integrated circuit element and with its distal end spaced from its corresponding pin element interior portion, a disconnected position with its proximal slot portion providing an interference fit with the pin of an integrated circuit element and with its distal end spaced from its corresponding pin element interior portion, and a connected position with its proximal slot portion providing an interference fit with the pin of an integrated circuit element and with its distal slot portion providing an interference fit with its corresponding pin element interior portion for electrical connection thereto.

3. An electronic programmable adapter for connecting a dual-in-line pin integrated circuit element to a dissimilar socket array, comprising a body of organic plastic insulating material having on one pair of opposite sides, on one side thereof a dual-in-line array of socket openings therein for receiving the pins of a dual-in-line pin integrated circuit element and on the opposite side thereof a dual-in-line array of pin element openings therein, each of said pin element openings being transversely spaced from and overlapping one of said socket openings and on the other pair of opposite sides, on each side thereof a single-in-line array of connector element openings therein, each of said connector element openings intersecting a corresponding socket opening and pin element opening a plurality of electrically conductive pin elements mounted in said pin element openings, each of said pin elements having an interior portion mounted in a said pin element opening and extending to a corresponding connector element opening an exterior pin portion for connection to a socket of a socket array, and an exterior tab portion a plurality of electrically conductive connector elements slideably mounted in said connector element openings, each of said connector elements having an interior portion slideably mounted in a said connector element opening said interior portion being bifurcated with a distal slot portion providing an interference fit with a said interior portion of a pin element for selective connection thereto and a proximal slot portion providing an interference fit with the pin of an integrated circuit element, each of said conductive connector elements having a disconnected position with its proximal slot portion providing an interference fit with the pin of an integrated circuit element and with its distal end spaced from its corresponding pin element interior portion, and a connected position with its proximal slot portion providing an interference fit with the pin of an integrated circuit element and with its distal slot portion providing an interference fit with its corresponding pin element interior portion for electrical connection thereto.

4. An electronic programmable adapter for connecting a dual-in-line pin integrated circuit element to a dissimilar socket array, comprising a body of organic plastic insulating material having on one pair of opposite sides, on one side thereof a dual-in-line array of socket openings therein for receiving the pins of a dual-in-line integrated circuit element and on the opposite side thereof a dual-in-line array of pin element openings therein, each of said pin element openings being parallel to, transversely spaced from and overlapping one of said socket openings and on the other pair of opposite sides, on each side thereof a single-in-line array of connector element openings therein, each of said connector element openings extending perpendicular to and intersecting a corresponding socket opening and pin element opening a plurality of electrically conductive pin elements mounted in said pin element openings, each of said pin elements having an interior portion mounted in a said pin element opening and extending to a corresponding connector element opening an exterior pin portion for connection to a socket of a socket array, and an exterior tab portion a plurality of electrically conductive connector elements slideably mounted in said connector element openings, each of said connector elements having an interior portion slideably mounted in a said connector element opening and an exterior tab portion, said interior portion being bifurcated with a central enlarged portion providing clearance for the free insertion of the pin of an integrated circuit element element, a distal slot portion extending inwardly on one side thereof and beyond said central enlarged portion providing an interference fit with a said interior portion of a pin element for selective connection thereto and a proximal slot portion extending outwardly on the other side thereof and beyond said central enlarged portion providing an interference fit with the pin of an integrated circuit element, each of said conductive connector elements having an initial position with said central enlarged portion concentric with its corresponding said socket opening for free insertion of the pin of an integrated circuit element and with its distal end spaced from its corresponding pin element interior portion, a disconnected position with its proximal slot portion providing an interference fit with the pin of an integrated circuit element and with its distal end spaced from its corresponding pin element interior portion, and a connected position with its proximal slot portion providing an interference fit with the pin of an integrated circuit element and with its distal slot portion providing an interference fit with its corresponding pin element interior portion for electrical connection thereto.

5. An adapter socket as claimed in claim 4, further including detent means for temporarily maintaining said connector element in its initial and disconnected positions.

6. An electronic programmable adapter for connecting an integrated circuit element to a dissimilar socket array, comprising a body of organic plastic insulating material having an array of socket openings therein for receiving the pins of an integrated circuit element an array of pin element openings therein, each of said pin element openings being transversely spaced from and overlapping one of said socket openings and an array of connector element openings therein, each of said connector element openings intersecting a corresponding socket opening and pin element opening a plurality of electrically conductive pin elements mounted in said pin element openings, each of said pin elements having an interior portion mounted in a said pin element opening and extending to a corresponding connector element opening and an exterior pin portion for connection to a socket of a socket array a plurality of electrically conductive connector elements slideably mounted in said connector element openings, each of said connector elements having an interior portion slideably mounted in a said connector element opening said interior portion being bifurcated with a central enlarged portion providing clearance for the free insertion of the pin of an integrated circuit element, a distal slot portion extending inwardly on one side thereof and beyond said central enlarged portion providing an interference fit with a said interior portion of a pin element for selective connection thereto and a proximal slot portion extending outwardly on the other side thereof and beyond said central enlarged portion providing an interference fit with the pin of an integrated circuit element, each of said conductive connector elements having an initial position with said central enlarged portion concentric with its corresponding said socket opening for free insertion of the pin of an integrated circuit element, and a connected position with its proximal slot portion providing an inteference fit with the pin of an integrated circuit element and with its distal slot portion providing an interference fit with its corresponding pin element interior portion for electrical connection thereto.

7. An electronic programmable adapter for connecting a dual-in-line pin integrated circuit element to a dissimilar socket array, comprising a body of organic plastic insulating material having on one pair of opposite sides, on one side thereof a dual-in-line array of socket openings therein for receiving the pins of a dual-in-line pin integrated circuit element and on the opposite side thereof a dual-in-line array of pin element openings therein, each of said pin element openings being parallel to, transversely spaced from and overlapping one of said socket openings and on the other pair of opposite sides, on each side thereof a single-in-line array of connector element openings therein, each of said connector element openings extending perpendicular to and intersecting a corresponding socket opening and pin element opening a plurality of electrically conductive pin elements mounted in said pin element openings, each of said pin elements having an interior portion mounted in a said pin element opening and extending to a corresponding connector element opening an exterior pin portion for connection to a socket of a socket array, and an exterior tab portion a plurality of electrically conductive connector elements slideably mounted in said connector element openings, each of said connector elements having an interior portion slideably mounted in a said connector element opening and an exterior tab portion, said interior portion being bifurcated with a central enlarged portion providing clearance for the free insertion of the pin of an integrated circuit element element, a distal slot portion extending inwardly on one side thereof and beyond said central enlarged portion providing an interference fit with a said interior portion of a pin element for selective connection thereto and a proximal slot portion extending outwardly on the other side thereof and beyond said central enlarged portion providing an interference fit with the pin of an integrated circuit element, each of said conductive connector elements having an initial position with said central enlarged portion concentric with its corresponding said socket opening for free insertion of the pin of an integrated circuit element, and a connected position with its proximal slot portion providing an interference fit with the pin of an integrated circuit element and with its distal slot portion providing an interference fit with its corresponding pin element interior portion for electrical connection thereto.

8. An adapter socket as claimed in claim 7, further including detent means for temporarily maintaining said connector element in its initial position.

* * * * *